United States Patent [19]

Iyer et al.

[11] Patent Number: 5,937,312
[45] Date of Patent: *Aug. 10, 1999

[54] SINGLE-ETCH STOP PROCESS FOR THE MANUFACTURE OF SILICON-ON-INSULATOR WAFERS

[75] Inventors: Subramanian S. Iyer, Yorktown Heights; Emil Baran, Brewster; Mark L. Mastroianni, Hopewell Jct., all of N.Y.; Robert A. Craven, Olivette, Mo.

[73] Assignee: SiBond L.L.C., St. Peters, Mo.

[*] Notice: This patent is subject to a terminal disclaimer.

[21] Appl. No.: 08/584,058

[22] Filed: Jan. 11, 1996

Related U.S. Application Data

[63] Continuation-in-part of application No. 08/409,208, Mar. 23, 1995, Pat. No. 5,494,849.

[51] Int. Cl.[6] ................................................ H01L 21/479
[52] U.S. Cl. .......................... 438/459; 438/455; 438/406; 438/977; 148/DIG. 12
[58] Field of Search .................... 438/455, 459, 438/406, 977; 148/DIG. 12

[56] References Cited

U.S. PATENT DOCUMENTS

| | | | |
|---|---|---|---|
| 3,748,790 | 7/1973 | Pizzarello et al. . | |
| 3,997,381 | 12/1976 | Wanlass | 156/3 |
| 4,601,779 | 7/1986 | Abernathey et al. | 156/628 |
| 4,649,627 | 3/1987 | Abernathey et al. | 29/571 |
| 4,735,679 | 4/1988 | Lasky | 156/636 |
| 4,771,016 | 9/1988 | Bajor et al. | 437/180 |
| 5,024,723 | 6/1991 | Goesele et al. | 156/628 |
| 5,032,544 | 7/1991 | Ito et al. | 437/228 |
| 5,071,785 | 12/1991 | Nakazato et al. | 437/62 |
| 5,152,857 | 10/1992 | Ito et al. | 156/153 |
| 5,213,993 | 5/1993 | Ogino et al. | 437/62 |
| 5,223,080 | 6/1993 | Ohta et al. | 156/626 |
| 5,227,339 | 7/1993 | Kishii | 437/225 |
| 5,234,535 | 8/1993 | Beyer et al. | 156/630 |
| 5,295,331 | 3/1994 | Honda et al. | 51/283 E |
| 5,298,452 | 3/1994 | Meyerson | 437/81 |
| 5,308,776 | 5/1994 | Gotou | 437/21 G |
| 5,310,451 | 5/1994 | Tejwani et al. | 156/630 |
| 5,340,435 | 8/1994 | Ito et al. | 156/632 |
| 5,344,524 | 9/1994 | Sharma et al. | 156/630 |
| 5,357,899 | 10/1994 | Bassous et al. | 117/4 |
| 5,494,849 | 2/1996 | Iyer et al. . | |

OTHER PUBLICATIONS

International Search Report issued Aug. 14, 1996 for PCT/US96/03794.

*Primary Examiner*—Trung Dang
*Attorney, Agent, or Firm*—Senniger, Powers, Leavitt & Roedel

[57] ABSTRACT

A single-etch stop process for the manufacture of silicon-on-insulator wafers. The process includes forming a silicon-on-insulator bonded wafers comprising a substrate layer, an oxide layer, a device layer, and a device wafer. The device layer is situated between the device wafer and the oxide layer and the oxide layer is between the device layer and the substrate layer. The device wafer has a p[+] or n[+] conductivity type and a resistivity ranging from about 0.005 ohm-cm to about 0.1 ohm-cm. A portion of the device wafer is removed from the silicon-on-insulator bonded wafers and the remaining portion of the device wafer has a defect-free surface after such removal. The remaining portion of the device wafer is then etched to expose the device layer.

39 Claims, 2 Drawing Sheets

SINGLE-ETCH STOP PROCESS FOR THE MANUFACTURE OF SILICON-ON-INSULATOR WAFERS

The present invention is a continuation-in-part of U.S. application Ser. No. 08/409,208, filed on Mar. 23, 1995, granted as U.S. Pat. No. 5,494,849, to Iyer et al.

This invention pertains to silicon-on-insulator (SOI) technology and, more particularly, to SOI substrates having relatively thick device layers with moderate thickness variation.

BACKGROUND OF THE INVENTION

An SOI bonded wafer has a handle or substrate layer, a device layer, and an oxide film (layer), constituting an insulating film, between the substrate layer and the device layer. It is typically made from two semiconductor silicon wafers each having at least one face with a specular gloss finish. An oxide layer is formed on the specular glossy face of one or both wafers, and the two wafers are joined together with the specular glossy faces facing each other and with the oxide layer being between the two wafers. One of the wafers constitutes a handle wafer and the other constitutes a device wafer. The exposed surface of the device wafer is ground and/or etched and polished until the device wafer becomes a thin layer, i.e., the device layer. The joined wafers are heated to an appropriate temperature to increase the bonding strength.

Although various approaches have been proposed for fabricating SOI substrates, each has been found lacking in some respect. In general, certain of the methods proposed to date will produce SOI wafers with defect-free device layers having relatively low thickness variation, but these methods typically produce SOI wafers in relatively low yield and at relatively high cost. Other methods which have been proposed to date will produce SOI wafers in relatively high yield and at a favorable cost, but these methods typically produce SOI wafers having device layers which have an unacceptable thickness variation or which contain defects.

SUMMARY OF THE INVENTION

Among the several objects of this invention may be noted the provision of an improved process for fabricating SOI wafers having a device layer thickness of at least about 0.5 micrometers; the provision of such a process in which the variation in the thickness of the device is no greater than about 10% of the thickness of the device layer across the surface of the substrate; and the provision of such a process which produces SOI substrates in relatively high yield and relatively low cost.

In accordance with one aspect of the present invention, therefore, a single-etch stop process for the manufacture of silicon-on-insulator wafers is provided. The process includes forming a silicon-on-insulator bonded wafer comprising a substrate layer, a device wafer, a device layer, and an oxide layer with the device layer being between the device wafer and the oxide layer and the oxide layer being between the device layer and the substrate layer. The device wafer has a $p^+$ conductivity type and a resistivity ranging from about 0.005 ohm-cm to about 0.1 ohm-cm. A portion of the device wafer is removed from the silicon-on-insulator bonded wafer and the remaining portion of the device wafer has a defect-free surface after such removal. The remaining portion of the device wafer is then etched to expose the device layer.

The invention is also directed, in another embodiment, to a process which includes forming a silicon-on-insulator bonded wafer as detailed above where the device wafer has a $n^+$ conductivity type and a resistivity ranging from about 0.005 ohm-cm to about 0.1 ohm-cm. A portion of the device wafer is removed from the silicon-on-insulator bonded wafer and the remaining portion of the device wafer has a defect-free surface after such removal. The remaining portion of the device wafer is then etched to expose the device layer.

The invention is further directed to a process in which a silicon-on-insulator bonded wafer is formed. The wafer comprises a substrate layer, an oxide layer, a device layer, and a device wafer. The device layer is situated between the device wafer and the oxide layer and has a thickness ranging between about 0.5 $\mu$m and 50 $\mu$m. The oxide layer lies between the device layer and the substrate layer. The device wafer has a $p^+$ or $n^+$ conductivity type and a resistivity ranging from about 0.005 ohm-cm to about 0.1 ohm-cm. A portion of the device wafer is removed from the silicon-on-insulator bonded wafer. The remaining portion of the device wafer having, after removal, has a defect-free surface and a total thickness variation of less than about 10 $\mu$m. The remaining portion of the device wafer is etched to expose the device layer by immersing the silicon-on-insulator bonded wafer in a bath containing hydrofluoric acid and nitric acid and further containing acetic acid or phosphoric acid. The device wafer surface is reactivated at least once, as necessary. The exposed device layer is polished to produce a polished silicon-on-insulator wafer.

Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
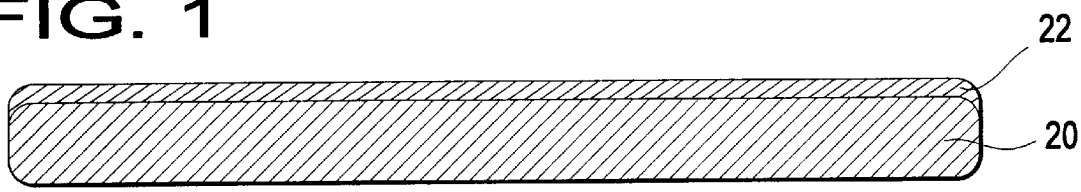
FIG. 1 is a schematic cross-sectional view of a device wafer used in a process of the present invention.

Referring now to the drawings, and more particularly to FIG. 1, a device layer 22 is deposited onto a device wafer 20 which is preferably silicon. The device wafer 20 is a $p^+$ or $n^+$ wafer having a resistivity ranging from about 0.005 ohm-cm to about 0.1 ohm-cm. Preferably, the wafer is a $p^+$, boron doped wafer, with the boron concentration being between about $1\times10^{17}$ and about $5\times10^{20}$ boron atoms/cm$^3$, and more preferably between about $1\times10^{18}$ and about $3\times10^{20}$ boron atoms/cm$^3$. For some applications, however, the wafer may be $n^+$ wafer, with the dopant being antimony, arsenic or phosphorous and the concentration of the dopant being between about $1\times10^{17}$ and about $5\times10^{20}$ atoms/cm$^3$, and preferably between about $5\times10^{18}$ and about $5\times10^{19}$ atoms/cm$^3$. The resistivity of the device wafer preferably ranges from about 0.01 ohm-cm to about 0.02 ohm-cm, and more preferably from about 0.01 ohm-cm to about 0.015 ohm-cm. The device wafer may have a thickness ranging from about 300 micrometers to about 800 micrometers and a diameter which may be, for example, 100, 125, 150, 200 millimeters or more.

The device layer 22 is preferably about 0.5 micrometers to about 50 micrometers thick and of a conductivity type and resistivity type (e.g., n or p⁻) to allow the use of preferential etchants as described herein. The device layer 22 is preferably deposited on the device wafer by epitaxial techniques known in the art, such as gas source molecular beam epitaxy ("MBE"), ultra high vacuum chemical vapor deposition ("UHCVD"), reduced pressure chemical vapor deposition ("CVD") or atmospheric pressure chemical vapor deposition ("APCVD"). Standard pre-epitaxial cleaning steps such as high temperature (e.g., at least about 900° C.) hydrogen pre-bakes may optionally be employed. In addition, an oxide layer may optionally be formed on epitaxial layer 22.

Figure 2:
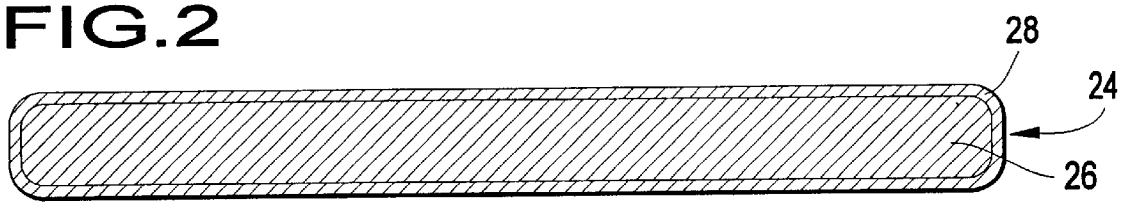
FIG. 2 is a schematic cross-sectional view of a handle wafer used in a process of the present invention.

As shown in FIG. 2, a handle wafer 24 preferably has a diameter which corresponds to the diameter of device wafer 20. The handle wafer 24 comprises a substrate layer 26 and an oxide layer 28. The substrate layer 26 may be any material suitable for support and handling, including, for example, an elemental semiconductor material, a compound semiconductor material, polycrystalline silicon, a glass material such as quartz, or a ceramic material such as aluminum oxide, aluminum nitride or silicon carbide. Silicon is a preferred material for the substrate layer. However, because the handle wafer merely serves as a means for handling the SOI bonded wafer, the substrate layer may be of low cost silicon. The conductivity type and resistivity of substrate layer are not critical. The substrate layer 26 may be patterned or unpatterned and may be of any desired thickness. Although thickness control is not critical for practicing the present invention, a uniform thickness is generally desirable and a total thickness variation on the order of about 10 micrometers or less is acceptable. Oxide layer 28 is grown on and surrounds the substrate layer 26 and preferably has a thickness of about 50 nm to about 5 micrometers.

Figure 3:
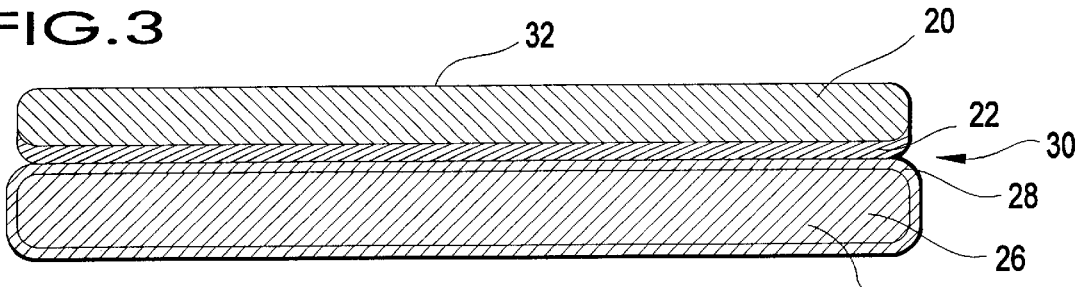
FIGS. 3–7 are schematic cross-sectional views of a silicon-on-insulator bonded wafer at various stages in a process of the present invention.

As shown in FIG. 3, the device wafer 20 is positioned on the handle wafer 24 so that the device layer 22 overlies the upper face of the handle wafer 24 and contacts the oxide layer 28. The device layer 22 is bonded to the oxide layer 28 at room temperature to form a bonded wafer, generally indicated at 30. The bond strength is thereafter increased by high temperature annealing. As shown in FIG. 3, an upper face 32 of the device wafer 20 is exposed.

The device wafer 20 is removed from the silicon-on-insulator bonded wafer 30 through a series of steps to expose device layer 22. Although the entire thickness of the device wafer 20 could be removed solely by mechanical methods, such methods leave the surface of the exposed device layer 22 unacceptably rough. Additionally, although it is within the scope of the present invention to remove the entire thickness of the device wafer solely by selective etching techniques, such etchants typically have slow etch rates and therefore require a significant amount of time to remove the device wafer 20.

Hence, in a preferred embodiment in which throughput is maximized while an acceptable surface on the device wafer 20 is obtained, a portion of the device wafer 20 is first mechanically removed from the bonded wafer 30, and the remaining portion of the device wafer 30 is then etched away to expose the device layer 22. Importantly, however, the roughness and damage created by mechanical removal should be eliminated prior to etching. That is, the remaining portion of the device wafer 20 has a defect-free surface after removal of the first portion of the device wafer 20. As used herein, the term "defect-free" means free from precipitated oxides and metal silicides and from defects in crystallinity such as stacking faults, partial dislocation loops, and threaded dislocations.

Referring to FIG. 3, the upper face 32 of the device wafer 20 is ground with a conventional grinder using a relatively coarse grinding wheel such as a D46 grind wheel sold by Genauigkeits Machinenbau Nürnberg (Nürnberg, Germany) or a 320 grit grind wheel sold by Disco Hi-Tec America, Inc. to thin the device wafer. In this rough grinding step, a substantial portion, but not the entire thickness of the device wafer is removed. The amount of material removed in this rough grinding step is determined, in part, by the total roughness of the silicon surface, $R_T$, after the rough grinding and the additional process steps which will be required to eliminate the roughness and damage created during the rough grinding step. Preferably, the average surface roughness, $R_a$, after the rough grinding step is less than about 0.5 μm, more preferably less than about 0.3 μm, and the total surface roughness, $R_T$, after the rough grinding step is less than about 5 μm, more preferably less than 3 μm. The average roughness, $R_a$, and the total surface roughness, $R_T$, for a rough ground surface may be determined using a profilomoter with the average roughness, $R_a$, being measured over a one square-centimeter area.

To remove the roughness and damage created in the rough grinding step, the surface of the device wafer is preferably subjected to a second grinding step, i.e., a fine grinding step. For fine grinding, a 1200 mesh finish grinding wheel may be used. The amount of material removed in the fine grinding step is at least about three times, preferably at least about five times the total surface roughness value, $R_T$, of the silicon surface after the rough grinding step. If the total surface roughness value, $R_T$, of the silicon surface after the rough grinding step is between about 3 and about 5 micrometers, therefore, the amount of material removed in the fine grinding step is about 10 to about 15 micrometers, more preferably about 13 to about 15 micrometers. Fine grinding, however, imparts its own roughness and damage to the silicon surface and typically, the silicon surface after the fine grinding step will have an average surface roughness, $R_a$, of less than 0.1 μm, more preferably less than about 0.02 μm, and a total surface roughness, $R_T$, of less than about 0.75 μm, more preferably less than about 0.4 μm. The average roughness, $R_a$, and the total surface roughness, $R_T$, for a fine ground surface may be determined using a profilomoter which is capable of measuring roughness values of a nanometer or less, with the average roughness, $R_a$, being measured over a one square-centimeter area.

Figure 4:
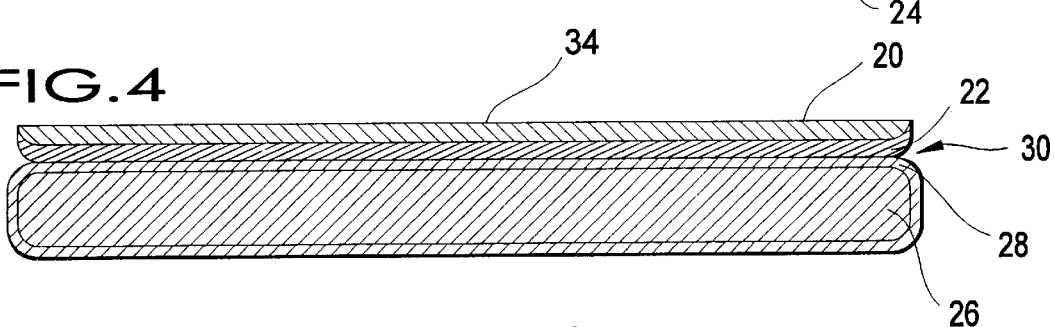

Referring to FIG. 4, the thinned device wafer 20, after grinding, has an exposed surface 34 and a thickness of about 20 to about 35 micrometers, more preferably, about 25 to about 30 micrometers. In addition, the grinding process should be controlled to minimize the total thickness variation ("TTV") across the ground wafer; for a 200 millimeter diameter wafer, for example, the TTV should be less than about 10 μm micrometers, more preferably less than about 5 μm, even more preferably less than about 2 micrometers, still more preferably less than about 0.8 micrometers and most preferably not more than about 0.5 micrometers.

The ground surface of the thinned device wafer is preferably polished to remove any damage to the exposed surface 34 of the device wafer 20 resulting from the grinding step(s). Polishing is carried out using conventional polishing equipment and commercially available polishing slurries such as a stabilized colloidal silica sol available from E. I. du Pont de Nemours & Company (Wilmington, Del.), Nalco Chemical Co. (Naperville, Ill.), and Cabot Corp. (Tuscolo, Ill.) to produce a surface having an average roughness, $R_a$, as measured on a 1 mm×1 mm scan with an optical interferometer, of less than 10 angstroms, preferably less than 1 angstrom.

The amount of silicon to be removed during the polishing step should be sufficient to remove all crystal damage remaining after the grinding steps such that the surface 34 is substantially defect-free. As a general rule, the amount of silicon to be removed should exceed about ten times the total surface roughness of the silicon surface after the fine grinding, i.e., $10 \times R_T$, wherein $R_T$ is the total surface roughness of the silicon surface after the fine grinding step. According to this rule, the amount of silicon removed during this polishing step would be about 10 µm to about 25 µm. If the fine-grinding step leaves the surface 34 sufficiently smooth, the amount of silicon needed to be removed during the polishing step would be from about 1 µm to about 20 µm. If, however, the fine-grinding step leaves the surface 34 in a rough state, up to about 100 µm of silicon may need to be removed. Therefore, removing 100 µm or more of silicon during polishing should generally be sufficient to yield a defect-free surface. The existence of a defect-free surface may be determined by techniques known in the art, including, for example, by bright light or automated laser inspection after cleaning the polished wafer surface.

Instead of mechanically removing device wafer 20, a significant portion of the device wafer may be removed by non-selective high removal rate chemical etching using, for example, an etchant comprising hydrofluoric acid, nitric acid, and acetic acid in the ratio of 3:5:3 parts by weight ($HF:HNO_3:CH_3COOH$) which is commonly referred to as CP-4. CP-4 etches silicon at a rate of about 80 micrometers per minute. Phosphoric acid may be used alternatively to, or in addition to acetic acid in the above etchant. The remaining portion of the device wafer 20 may then be removed by smooth grinding, polishing or a combination of smooth grinding and polishing as described above. If non-selective etchants are selected, care should be taken to ensure that the etching is discontinued before the device layer is reached. Regardless of how the portion of the device wafer 20 is removed, the thickness of the device layer prior to etching should range from less than about 1 µm to about 50 µm.

Figure 5:
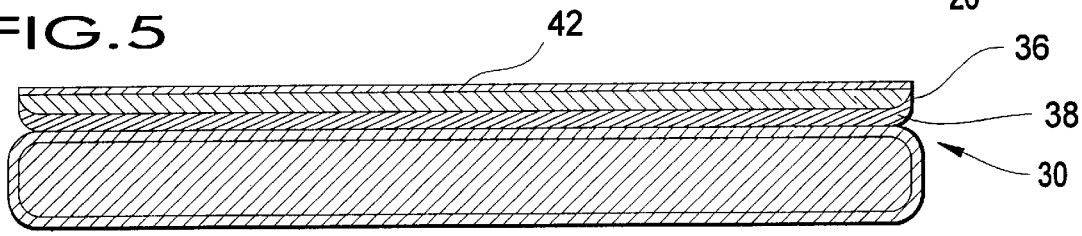
Figure 6:
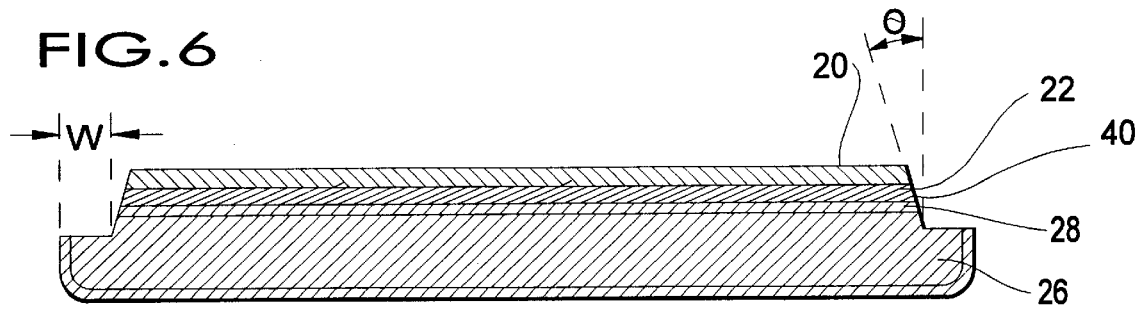

Referring to FIG. 5, the periphery of the bonded wafer 30 may optionally be trimmed after grinding and prior to polishing to remove the edge margins 36, 38 which may contain areas of delamination between the device layer and the oxide layer. The width w (FIG. 6) of edge margins removed is approximately 2–10 mm. Also, the periphery of the bonded wafer 30 is preferably abraded at an angle θ (preferably 0–30°) to form a beveled edge 40 to minimize the trapping of particles in the corner of that edge. The periphery of the bonded wafer 30 may be abraded by grinding, wet or dry etching, or by a chemical/mechanical polishing process. Masking 42 which is applied prior to the abrading process prevents debris, generated during the abrading process, from pitting or otherwise damaging the $p^+$ device wafer 20 and device layer 22. After the periphery of the bonded wafer 30 is abraded, the masking 42 is stripped from the top surface of the bonded wafer.

Figure 7:
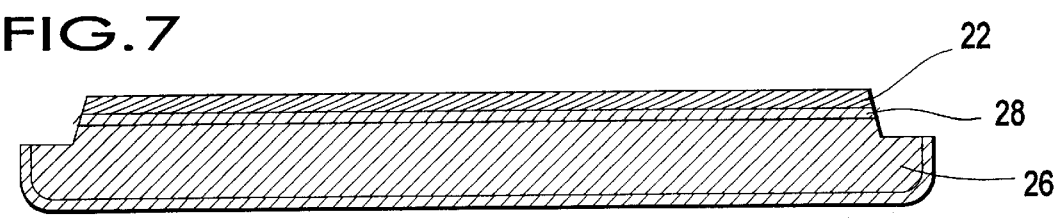

Referring now to FIG. 7, the ground, polished and optionally edge-stripped device wafer 20 is immersed in a suitable etchant which preferentially etches the remaining portion of the device wafer 30 without etching the device layer 22. Such etchants are well known in the art. When the device wafer 30 is a $p^+$ boron doped material at the concentrations detailed above, suitable etchants include, for example, mixtures of hydrofluoric acid, nitric acid and acetic acid in a ratio of about 1:3:6–12 parts by weight ($HF:HNO_3:CH_3COOH$), and more preferably about 1:3:8 parts by weight ($HF:HNO_3:CH_3COOH$), and at a temperature of about 20° C. to about 30° C. A surfactant such as FC-193 manufactured by 3M Company may be added to improve the etching performance.

Autocatalytic poisoning will typically cause a reduction of the etch rate and eventually the cessation of etching after about several hundred nanometers (i.e., about 200 to about 300 nanometers) of silicon are etched from the surface. Bubbles transcending the surface of the device wafer 20 being etched can cause bubble tracks and mask further etching, especially when the bonded wafer 30 is oriented such that the surface 34 of the device wafer 20 is in a vertical plane. The problem is minimized by positioning the bonded wafer so that the surface 34 is at an incline. It is also desirable to rotate the wafers periodically.

Moreover, the etchant may be continuously reconditioned by adding oxidants such as hydrogen peroxide or ozone, or other reconditioning agents, or alternatively, intermittently reconditioned by withdrawing the wafer from the etchant and immersing it in water, oxygenated water, ozonated water (e.g., about 1–2% by weight ozone) or by exposing it to air or other oxidizing atmosphere or fluid for about 1 to about 10 seconds, preferably about 1 to about 5 seconds. The reactivated surface is then reimmersed in the etchant and etching proceeds vigorously until another several hundred nanometers are removed.

This process of reactivating the surface and immersing the reactivated surface in the etchant is continued until the device wafer 20 is removed and the device layer 22 is exposed at which point no amount of air/water exposure will reactivate the surface. In general, the amount of silicon removed in this etching step is about 3 micrometers, and preferably between about 3 and about 10 micrometers.

Alternatively, the ground, polished and optionally edge-stripped device wafer 20 may be etched using a rotating chuck and a spray. In this embodiment, the device wafer is mounted onto the chuck and rotated. Etchant is dispensed through a nozzle array which is attached to a movable arm and directed at the surface of the rotating wafer. The exact orientation, position and movement of the nozzle array, the rate of rotation of the wafer, the composition of the etchant, and the dispense rate of the etchant can be controlled to achieve a uniform and controlled etch rate. In addition, the surface can be reactivated (if autocatalytic poisoning occurs) by dispensing water, oxygenated or ozonated water, filtered air or the like through the nozzle array instead of etchant. Upon completion of the etching, the wafer may be spun dried.

Typically, the etched surface may become mildly stained. To remove the stain, the exposed device layer may be subjected to a "touch" polish. That is, only about 100 nm to about 1 µm and preferably about 200 nm to about 400 nm of silicon is removed in a chemical/mechanical polishing process using, for example, conventional polishing equipment and a commercially available slurry, such as a dilute ammonia stabilized colloidal silica slurry. A preferred ammonia stabilized colloidal silica slurry is Glanzox 3900, which is commercially available from Fujimi Incorporated of Aichi Pref. 452, Japan. Glanzox 3900 has a silica content of from about 8 to about 10% and a particle size of from about 0.025 to about 0.035 µm. If the ammonia stabilized silica slurry is not diluted prior to use, the polished wafer will not be as smooth as a wafer treated with a diluted slurry. A dilution of about one part silica slurry to about 10 parts deionized water is preferred.

The stain may alternatively be removed by etching methods. For example, etching the stained surface with a polishing etchant such as an aqueous solution of HF and $HNO_3$ having a ratio of about 1:200 parts by volume $HF:HNO_3$ (supplied as 49 wt. % HF in water and 69 wt. % $HNO_3$ in water, respectively) can be effective.

After touch polishing, the device layer 22 has a thickness of about 0.5 to about 50 micrometers, preferably about 0.5 to about 20 micrometers, and a surface which is characteristic of a polished, conventional silicon wafer. That is, the resulting device layer has a surface with an average roughness, $R_a$, of no more than about 0.5 to 1 Angstrom over a surface of about 1 $\mu m^2$ scan with an optical interferometer or an atomic force microscope and a TTV which is about 10% of the maximum thickness of the device layer for a device layer thickness of about 3 microns and less and a TTV which is less than 10% of the maximum thickness of the device layer for a device layer thickness of between 3 and 50 microns.

To getter any residual boron in the device layer, the polished surface may be thermally oxidized at a temperature greater than about 900° C. Any residual boron is segregated in the oxide which is then stripped using, for example, an aqueous solution containing hydrofluoric acid.

As previously described, the high temperature annealing step (to increase the bonding strength between the device layer of the device wafer and the oxide layer of the handle wafer) may be carried out immediately after the room temperature bonding step. Alternatively, however, the high temperature annealing step may be carried out after the device wafer is etched away and the device layer is exposed. Deferring the high temperature annealing step until after the device wafer is removed advantageously minimizes the diffusion of boron from the $p^+$ device wafer into the device layer.

In view of the above, it will be seen that the several objects of the invention are achieved and other advantageous results attained. As various changes could be made in the above constructions and processes without departing from the scope of the invention, it is intended that all matter contained in the above description or shown in the accompanying drawings shall be interpreted as illustrative and not in a limiting sense.

What is claimed is:

1. A single-etch stop process for the manufacture of silicon-on-insulator wafers, the process comprising
    forming a silicon-on-insulator bonded wafer comprising a substrate layer, an oxide layer, a device layer, and a device wafer, the device layer being between the device wafer and the oxide layer and the oxide layer being between the device layer and the substrate layer, the device wafer having a p+ conductivity type and a resistivity ranging from about 0.005 ohm-cm to about 0.1 ohm-cm,
    removing a portion of the device wafer from the silicon-on-insulator bonded wafer, the remaining portion of the device wafer having a defect-free surface after removal, and
    immersing the silicon-on-insulator bonded wafer in an etching solution to preferentially etch the remaining portion of the device wafer to expose the device layer.

2. The process of claim 1 wherein the device layer has a thickness ranging between about 0.5 and 50 $\mu$m.

3. The process of claim 1 wherein the device wafer has a boron concentration of at least about $1\times10^{17}$ boron atoms/$cm^3$.

4. The process of claim 1 wherein after a portion of the device wafer is removed, the remaining portion of the device wafer has a total thickness variation of less than about 10 $\mu$m.

5. The process of claim 1 further comprising polishing the exposed device layer to produce a polished silicon-on-insulator wafer.

6. The process of claim 5 wherein the polished silicon-on-insulator wafer has a total thickness variation which does not exceed 10% of the maximum thickness of the device layer.

7. The process of claim 5 wherein no more than about 1 $\mu$m of silicon are removed when the exposed device layer is polished.

8. The process of claim 1 wherein the step of removing a portion of the device wafer comprises a coarse material removal stage followed by a smooth grinding stage.

9. The process of claim 8 wherein the coarse material removal stage comprises chemically etching or grinding.

10. The process of claim 8 wherein the step of removing a portion of the device wafer further comprises polishing the surface of the device wafer after the smooth grinding stage.

11. The process of claim 1 wherein the step of etching the remaining portion of the device wafer comprises
    immersing the silicon-on-insulator bonded wafer in a bath containing hydrofluoric acid and nitric acid and further containing acetic acid or phosphoric acid, and
    reconditioning the bath by adding peroxide, ozone or other reconditioning agent to the bath.

12. The process of claim 1 wherein the step of etching the remaining portion of the device wafer comprises
    immersing the silicon-on-insulator bonded wafer in a bath containing hydrofluoric acid and nitric acid and further containing acetic acid or phosphoric acid, and
    after the etch rate begins to diminish, withdrawing the silicon-on-insulator bonded wafer from the bath, reactivating the device wafer surface, and reimmersing the silicon-on-insulator bonded wafer in the bath.

13. The process of claim 12 wherein the device wafer surface is reactivated by being immersed in water or by being exposed to air or other oxidizing atmosphere or fluid.

14. The process of claim 12 wherein the steps of reactivating the device wafer surface and reimmersing the silicon-on-insulator bonded wafer in the bath containing hydrofluoric acid, nitric acid and acetic acid are repeated at least twice.

15. The process of claim 14 wherein the device wafer surface is reactivated by being immersed in water or by being exposed to air or other oxidizing atmosphere or fluid.

16. The process of claim 14 wherein the surface is reactivated by immersing the surface in water, the water containing ozone.

17. The process of claim 1 wherein the exposed device layer is polished using a colloidal silica slurry.

18. The process of claim 1 wherein after a portion of the device wafer is removed, the thickness of the device wafer ranges from about 1 $\mu$m to about 50 $\mu$m.

19. The process of claim 1 further comprising subjecting the silicon-on-insulator bonded wafer to a high temperature annealing step after the remaining portion of the device wafer is etched.

20. The process of claim 1 further comprising edge trimming the device layer.

21. A single-etch stop process for the manufacture of silicon-on-insulator wafers, the process comprising
    forming a silicon-on-insulator bonded wafer comprising a substrate layer, an oxide layer, a device layer, and a device wafer, the device layer being between the device wafer and the oxide layer and the oxide layer being between the device layer and the substrate layer, the device wafer having an n+ conductivity type and a resistivity ranging from about 0.005 ohm-cm to about 0.1 ohm-cm,
    removing a portion of the device wafer from the silicon-on-insulator bonded wafer, the remaining portion of the device wafer having a defect-free surface after removal, and immersing the silicon-on-insulator bonded wafer in an etching solution to preferentially etch the remaining portion of the device wafer to expose the device layer.

22. The process of claim 21 further comprising polishing the exposed device layer to produce a polished silicon-on-insulator wafer.

23. The process of claim 22 wherein the polished silicon-on-insulator wafer has a total thickness variation which does not exceed 10% of the maximum thickness of the device layer.

24. The process of claim 22 wherein no more than about 1 $\mu$m of silicon are removed when the exposed device layer is polished.

25. The process of claim 21 wherein the exposed device layer is polished using a colloidal silica slurry.

26. The process of claim 21 wherein after a portion of the device wafer is removed, the thickness of the device wafer ranges from about 1 $\mu$m to about 50 $\mu$m.

27. The process of claim 21 further comprising subjecting the silicon-on-insulator bonded wafer to a high temperature annealing step after the remaining portion of the device wafer is etched.

28. The process of claim 21 further comprising edge trimming the device layer.

29. A single-etch stop process for the manufacture of silicon-on-insulator wafers, the process comprising forming a silicon-on-insulator bonded wafer comprising a substrate layer, an oxide layer, a device layer, and a device wafer, the device layer being between the device wafer and the oxide layer and having a thickness ranging between about 0.5 $\mu$m and 50 $\mu$m, the oxide layer being between the device layer and the substrate layer, the device wafer having a p+ or n+ conductivity type and a resistivity ranging from about 0.005 ohm-cm to about 0.1 ohm-cm, removing a portion of the device wafer from the silicon-on-insulator bonded wafer, the remaining portion of the device wafer having, after removal, a defect-free surface and a total thickness variation of less than about 10 $\mu$m, immersing the silicon-on-insulator bonded wafer in an etching solution to preferentially etch the remaining portion of the device wafer to expose the device layer, reactivating the device wafer surface, and polishing the exposed device layer to produce a polished silicon-on-insulator wafer.

30. A single-etch stop process for the manufacture of silicon-on-insulator wafers, the process comprising forming a silicon-on-insulator bonded wafer comprising a substrate layer, an oxide layer, a device layer, and a device wafer, the device layer being between the device wafer and the oxide layer and the oxide layer being between the device layer and the substrate layer, the device wafer having a p$^+$ or n$^+$ conductivity type and a resistivity ranging from about 0.005 ohm-cm to about 0.1 ohm-cm, removing a portion of the device wafer from the silicon-on-insulator bonded wafer, immersing the remaining portion of the device wafer in an etchant containing hydrofluoric acid and nitric acid and further containing acetic acid or phosphoric acid, and after the etch rate of the device wafer begins to diminish, withdrawing the silicon-on-insulator bonded wafer from the etchant, reactivating the device wafer surface, and reimmersing the silicon-on-insulator bonded wafer in the etchant.

31. A single-etch stop process for the manufacture of silicon-on-insulator wafers, the process comprising forming a silicon-on-insulator bonded wafer comprising a substrate layer, an oxide layer, a device layer, and a device wafer, the device layer being between the device wafer and the oxide layer and the oxide layer being between the device layer and the substrate layer, the device wafer having a p+ conductivity type and a resistivity ranging from about 0.005 ohm-cm to about 0.1 ohm-cm, removing a substantial portion of the device wafer from the silicon-on-insulator bonded wafer by rough grinding, removing a portion of the rough ground device wafer from the silicon-on-insulator bonded wafer by fine grinding, removing a portion of the fine ground device wafer from the silicon-on-insulator bonded wafer by polishing, the remaining portion of the device wafer having a defect-free surface after removal, and immersing the silicon-on-insulator bonded wafer in an etching solution to preferentially etch the remaining portion of the polished device wafer to expose the device layer.

32. The process of claim 31 wherein after the fine grinding the surface of the remaining portion of the device wafer has an average roughness of less than about 0.1 $\mu$m as determined over an area of 1 cm$^2$ with a profilometer.

33. The process of claim 1 wherein after a portion of the device wafer is removed, the surface of the remaining portion of the device wafer has an average roughness of less than about 10 angstroms as determined over an area of 1 mm$^2$ with an optical interferometer.

34. The process of claim 31 wherein after the fine grinding the surface of the remaining portion of the device wafer has an average roughness of less than about 0.02 $\mu$m as determined over an area of 1 cm$^2$ with a profilometer.

35. A single-etch stop process for the manufacture of silicon-on-insulator wafers, the process comprising forming a silicon-on-insulator bonded wafer comprising a substrate layer, an oxide layer, a device layer, and a device wafer, the device layer being between the device wafer and the oxide layer and the oxide layer being between the device layer and the substrate layer, the device wafer having a n+ conductivity type and a resistivity ranging from about 0.005 ohm-cm to about 0.1 ohm-cm, removing a substantial portion of the device wafer from the silicon-on-insulator bonded wafer by rough grinding, removing a portion of the rough ground device wafer from the silicon-on-insulator bonded wafer by fine grinding, removing a portion of the fine ground device wafer from the silicon-on-insulator bonded wafer by polishing, the remaining portion of the device wafer having a defect-free surface after removal, and immersing the silicon-on-insulator bonded wafer in an etching solution to preferentially etch the remaining portion of the polished device wafer to expose the device layer.

36. The process of claim 21 wherein after a portion of the device wafer is removed, the surface of the remaining portion of the device wafer has an average roughness of less than about 10 angstroms as determined over an area of 1 mm$^2$ with an optical interferometer.

37. The process of claim 29 wherein after a portion of the device wafer is removed, the surface of the remaining portion of the device wafer has an average roughness of less than about 10 angstroms as determined over an area of 1 mm$^2$ with an optical interferometer.

38. The process of claim 35 wherein after the fine grinding the surface of the remaining portion of the device wafer has an average roughness of less than about 0.1 $\mu$m as determined over an area of 1 cm$^2$ with a profilometer.

39. The process of claim 35 wherein after the fine grinding the surface of the remaining portion of the device wafer has an average roughness of less than about 0.02 $\mu$m as determined over an area of 1 cm$^2$ with a profilometer.

* * * * *

UNITED STATES PATENT AND TRADEMARK OFFICE
CERTIFICATE OF CORRECTION

PATENT NO.   : 5,937,312
DATED        : August 10, 1999
INVENTOR(S)  : Subramanian S. Iyer et al.

It is certified that error appears in the above-identified patent and that said Letters Patent is hereby corrected as shown below:

<u>Column 8, claim 7,</u>
Line 6, "silicon are removed" should read -- silicon is removed --.

<u>Column 9, claim 24,</u>
Line 12, "silicon are removed" should read -- silicon is removed --.

Signed and Sealed this

Fourth Day of December, 2001

*Attest:*

*Attesting Officer*

NICHOLAS P. GODICI
*Acting Director of the United States Patent and Trademark Office*